US010714183B2

(12) United States Patent
Kim et al.

(10) Patent No.: US 10,714,183 B2
(45) Date of Patent: Jul. 14, 2020

(54) HIGH VOLTAGE SWITCH CIRCUIT, NONVOLATILE MEMORY DEVICE INCLUDING THE SAME AND MEMORY SYSTEM INCLUDING THE SAME

(71) Applicant: SAMSUNG ELECTRONICS CO., LTD., Suwon-si, Gyeonggi-do (KR)

(72) Inventors: Jong-Kyu Kim, Hwaseong-si (KR); Young-Sun Min, Hwaseong-si (KR); Dae-Seok Byeon, Seongnam-si (KR); Ho-Kil Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/422,213

(22) Filed: May 24, 2019

(65) Prior Publication Data

US 2020/0118629 A1  Apr. 16, 2020

(30) Foreign Application Priority Data

Oct. 15, 2018 (KR) .................. 10-2018-0122677

(51) Int. Cl.
*G11C 16/08* (2006.01)
*G11C 16/30* (2006.01)
*G11C 16/34* (2006.01)
*G11C 16/04* (2006.01)
*G11C 16/32* (2006.01)
*G11C 16/10* (2006.01)
(Continued)

(52) U.S. Cl.
CPC .......... *G11C 16/08* (2013.01); *G11C 16/0483* (2013.01); *G11C 16/32* (2013.01); *G11C 16/10* (2013.01); *G11C 16/14* (2013.01); *G11C 16/26* (2013.01); *G11C 16/30* (2013.01); *G11C 16/3445* (2013.01); *G11C 16/3459* (2013.01)

(58) Field of Classification Search
CPC .......... G11C 16/08; G11C 16/14; G11C 16/30
USPC .................................... 365/185.23
See application file for complete search history.

(56) References Cited

U.S. PATENT DOCUMENTS 7,135,914 B2   11/2006  Chih et al.
7,679,133 B2    3/2010  Son et al.
7,733,710 B2    6/2010  Ha et al.
(Continued)

FOREIGN PATENT DOCUMENTS

JP    2009-0245556 A   10/2009
KR    10-2008-0040207 A   5/2008

*Primary Examiner* — Anthan Tran
(74) *Attorney, Agent, or Firm* — Lee IP Law, P.C.

(57) ABSTRACT

A high voltage switch circuit includes a first transistor, a first depletion mode transistor, a level shifter, a control signal generator, a second transistor and a second depletion mode transistor. The first transistor transmits the second driving voltage to an output terminal in response to a first gate signal. The first depletion mode transistor transmits the second driving voltage to the first transistor in response to feedback from the output terminal. The control signal generator generates first and second control signals in response to a level-shifted enable signal. The second transistor has a gate electrode connected to the first voltage and is turned on and off in response to the second control signal at a first end of the second transistor. The second depletion mode transistor is connected between a second end of the second transistor and the output terminal, and has a gate electrode receiving the first control signal.

20 Claims, 11 Drawing Sheets

(51) Int. Cl.
*G11C 16/26* (2006.01)
*G11C 16/14* (2006.01)

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 9,178,508 B2 | 11/2015 | Wong |
| 9,721,667 B2 | 8/2017 | Son et al. |
| 2009/0244968 A1 | 10/2009 | Maejima |
| 2011/0233648 A1 | 9/2011 | Seol et al. |
| 2011/0273940 A1* | 11/2011 | Tanzawa ............... G11C 16/08 365/189.11 |
| 2012/0163087 A1* | 6/2012 | Hung ..................... G11C 8/10 365/185.18 |
| 2013/0088284 A1* | 4/2013 | Jeong ..................... G11C 8/08 327/537 |
| 2013/0194020 A1* | 8/2013 | Shen ................... H03K 19/0013 327/333 |
| 2014/0003149 A1* | 1/2014 | Maejima ............. H01L 27/1157 365/185.17 |
| 2014/0254284 A1* | 9/2014 | Hung ................... G11C 16/16 365/185.23 |
| 2015/0138893 A1* | 5/2015 | Kim ...................... G11C 16/08 365/185.23 |
| 2018/0075915 A1 | 3/2018 | Lee et al. |

\* cited by examiner

HIGH VOLTAGE SWITCH CIRCUIT, NONVOLATILE MEMORY DEVICE INCLUDING THE SAME AND MEMORY SYSTEM INCLUDING THE SAME

CROSS-REFERENCE TO RELATED APPLICATION

Korean Patent Application No. 10-2018-0122677, filed on Oct. 15, 2018 in the Korean Intellectual Property Office (KIPO), and entitled: "High Voltage Switch Circuit, Nonvolatile Memory Device Including the Same and Memory System Including the Same," is incorporated by reference herein in its entirety.

BACKGROUND

1. Field

Example embodiments relate generally to semiconductor devices, and more particularly to high voltage switch circuits, nonvolatile memory devices including the high voltage switch circuits and memory systems including the nonvolatile memory devices.

2. Description of the Related Art

Semiconductor memory devices can generally be divided into two categories depending upon whether or not stored data is retained when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Examples of nonvolatile memory devices include a flash memory.

A flash memory typically requires a program and/or erase voltage that is higher than a power supply voltage provided from an external source. For example, the erase voltage may be about 20V. A flash memory includes a high voltage switch circuit, which in turn provides a related high voltage to a memory cell array, to control these or other high voltages.

SUMMARY

According to example embodiments, a high voltage switch circuit includes a first transistor, a first depletion mode transistor, a level shifter, a control signal generator, a second transistor and a second depletion mode transistor. The first transistor transmits the second driving voltage to an output terminal in response to a first gate signal. The first depletion mode transistor transmits the second driving voltage to the first transistor in response to an output signal fed back from the output terminal. The level shifter shifts a level of an enable signal based on a first voltage to generate a level-shifted enable signal. The control signal generator generates a first control signal and a second control signal in response to the level-shifted enable signal. The second transistor has a gate electrode receiving the first voltage and is turned on and off in response to the second control signal received at a first end of the second transistor. The second depletion mode transistor is connected between a second end of the second transistor and the output terminal and has a gate electrode receiving the first control signal.

According to example embodiments, a nonvolatile memory device includes a memory cell array, a pass transistor and a high voltage switch circuit. The memory cell array includes a memory cell connected to a wordline and a bitline. The pass transistor transmits a first high voltage to the wordline. The high voltage switch circuit boosts a level of an enable signal to a level of a second high voltage to provide a boosted enable signal to a gate electrode of the pass transistor. The high voltage switch circuit includes a first transistor, a first depletion mode transistor, a level shifter, a control signal generator, a second transistor and a second depletion mode transistor. The first transistor transmits the second high voltage to an output terminal in response to a first gate signal. The first depletion mode transistor transmits the second high voltage to the first transistor in response to an output signal fed back from the output terminal. The level shifter shifts the level of the enable signal based on a first voltage to generate a level-shifted enable signal. The control signal generator generates a first control signal and a second control signal in response to the level-shifted enable signal. The second transistor has a gate electrode receiving the first voltage and is turned on and off in response to the second control signal received at a first end of the second transistor. The second depletion mode transistor is connected between a second end of the second transistor and the output terminal and has a gate electrode receiving the first control signal.

According to example embodiments, a memory system includes a memory controller and a nonvolatile memory device controlled by the memory controller. The nonvolatile memory device includes a memory cell array, a pass transistor and a high voltage switch circuit. The memory cell array includes a memory cell connected to a wordline and a bitline. The pass transistor transmits a first high voltage to the wordline. The high voltage switch circuit boosts a level of an enable signal to a level of a second high voltage to provide a boosted enable signal to a gate electrode of the pass transistor. The high voltage switch circuit includes a first transistor, a first depletion mode transistor, a level shifter, a control signal generator, a second transistor and a second depletion mode transistor. The first transistor transmits the second high voltage to an output terminal in response to a first gate signal. The first depletion mode transistor transmits the second high voltage to the first transistor in response to an output signal fed back from the output terminal. The level shifter shifts the level of the enable signal based on a first voltage to generate a level-shifted enable signal. The control signal generator generates a first control signal and a second control signal in response to the level-shifted enable signal. The second transistor has a gate electrode receiving the first voltage and is turned on and off in response to the second control signal received at a first end of the second transistor. The second depletion mode transistor is connected between a second end of the second transistor and the output terminal and has a gate electrode receiving the first control signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
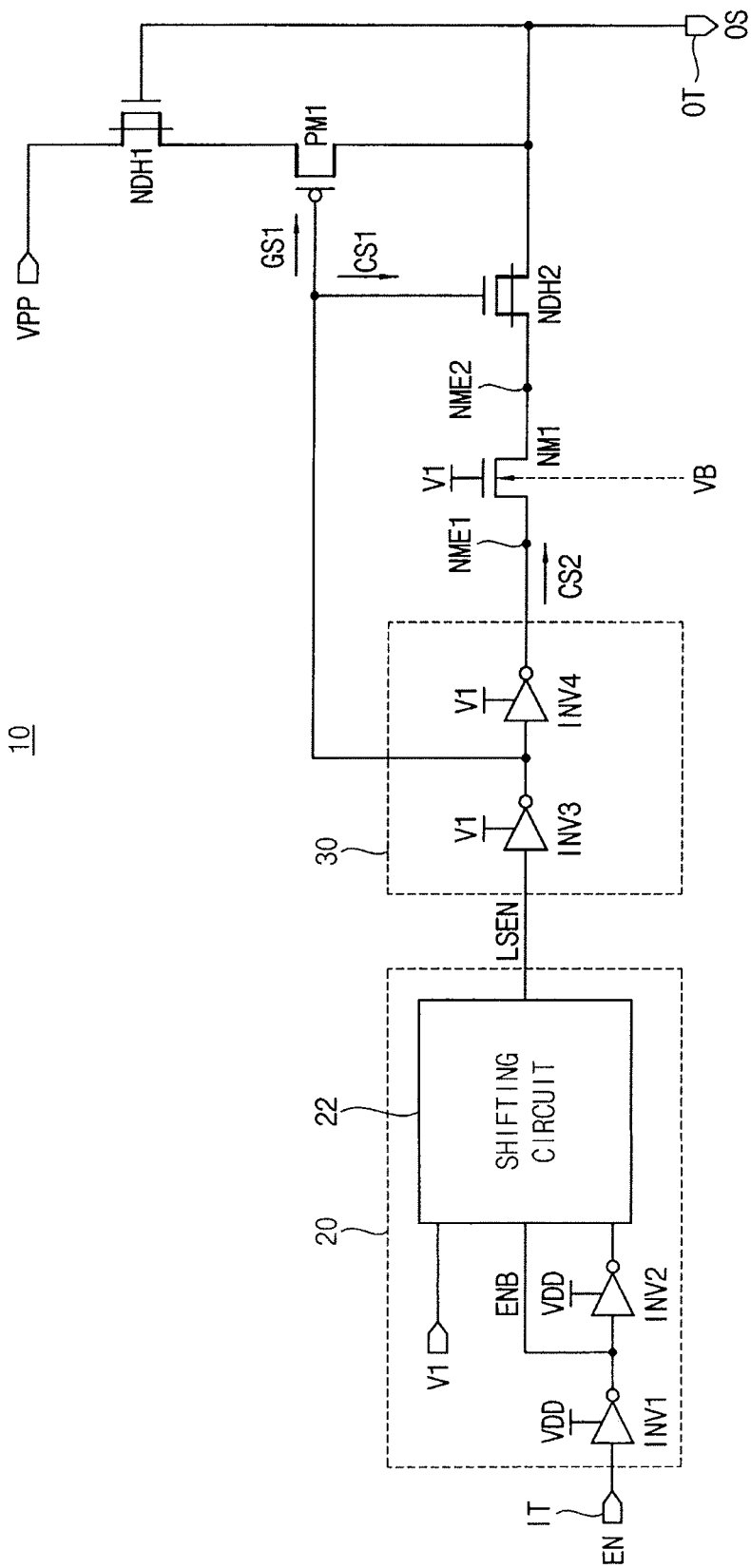
FIG. 1 illustrates a circuit diagram of a high voltage switch circuit according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a circuit diagram illustrating a high voltage switch circuit according to example embodiments. Referring to FIG. 1, a high voltage switch circuit 10 includes a first transistor PM1, a first depletion mode transistor NDH1, a second transistor NM1, a second depletion mode transistor NDH2, a level shifter 20, and a control signal generator 30. The high voltage switch circuit 10 may further include an input terminal IT and an output terminal OT.

The high voltage switch circuit 10 is included in a nonvolatile memory device (e.g., a nonvolatile memory device 100 of FIG. 6) and operates in response to a first driving voltage VDD and a second driving voltage VPP higher than the first driving voltage VDD. For example, the high voltage switch circuit 10 may receive the first driving voltage VDD, which is a relatively low voltage, the second driving voltage VPP, which is a relatively high voltage, and an input signal (e.g., an enable signal EN) which is based on the first driving voltage VDD, and may change (e.g., boost) a level of the input signal to a level of the second driving voltage VPP.

The first driving voltage VDD may be a power supply voltage for driving the nonvolatile memory device. For example, a level of the first driving voltage VDD may be about 2.0V. The second driving voltage VPP may be a high voltage which is provided from inside or outside the nonvolatile memory device and is higher than the first driving voltage VDD. For example, a level of the second driving voltage VPP may be higher than about 20V and may be e.g., about 28.5V.

The high voltage switch circuit 10 also operates in response to a first voltage V1. The first voltage V1 may be a voltage for driving the high voltage switch circuit 10. The first voltage V1 may be higher than the first driving voltage VDD and lower than the second driving voltage VPP. For example, a level of the first voltage V1 may be about 2.5V.

The first transistor PM1 transmits the second driving voltage VPP to the output terminal OT in response to a first gate signal GS1 applied to a gate electrode of the first transistor PM1. For example, the first transistor PM1 may be a high voltage p-type metal oxide semiconductor (PMOS) transistor.

The first depletion mode transistor NDH1 transmits the second driving voltage VPP to the first transistor PM1 in response to an output signal OS applied to a gate electrode of the first depletion mode transistor NDH1 and fed back from the output terminal OT. For example, the first depletion mode transistor NDH1 may be a high voltage n-type depletion mode transistor having a threshold voltage Vth.

The first transistor PM1 and the first depletion mode transistor NDH1 may form or constitute a feedback structure to provide the output signal OS. For example, the second driving voltage VPP may be provided to a first electrode (e.g., a drain electrode) of the first depletion mode transistor NDH1. When the enable signal EN is activated, the first transistor PM1 may be turned on in response to the first gate signal GS1. At an initial operation time, a voltage level of the output signal OS may be substantially equal to a level of a ground voltage (e.g., GND) immediately after the enable signal EN is activated, and thus a voltage at the gate electrode of the first depletion mode transistor NDH1 may also be substantially equal to the level of the ground voltage GND. A voltage at a first electrode (e.g., a source electrode) of the first transistor PM1 may increase to the threshold voltage Vth of the first depletion mode transistor NDH1. Thus, the output signal OS may become the threshold voltage Vth of the first depletion mode transistor NDH1. The output signal OS may be fed back to the gate electrode of the first depletion mode transistor NDH1. The voltage at the first electrode of the first transistor PM1 may increase to a sum of the output signal OS and the threshold voltage Vth of the first depletion mode transistor NDH1. By repeating those processes, the output signal OS may increase to the level of the second drive voltage VPP.

The level shifter 20 shifts (e.g., level-shifts) a level of the enable signal EN based on the first voltage V1 to generate a level-shifted enable signal LSEN. For example, a high level of the enable signal EN received from the input terminal IT may be substantially equal to the level of the first driving voltage VDD and a high level of the level-shifted enable signal LSEN may be substantially equal to the level of the first voltage V1. A phase of the level-shifted enable signal LSEN may be substantially the same as a phase of the enable signal EN.

The level shifter 20 may include a first inverter INV1, a second inverter INV2 and a shifting circuit 22. The first inverter INV1 may invert the enable signal EN to generate an inverted enable signal ENB. The second inverter INV2 may invert the inverted enable signal ENB to generate a signal that is substantially the same as the enable signal EN. Each of the first inverter INV1 and the second inverter INV2 may operate in response to the first driving voltage VDD. Thus, as with the enable signal EN, a high level of the inverted enable signal ENB may be substantially equal to the level of the first driving voltage VDD.

The shifting circuit 22 may generate the level-shifted enable signal LSEN in response to the first voltage V1, the enable signal EN and the inverted enable signal ENB. In some example embodiments, one of the first inverter INV1 and the second inverter INV2 may be omitted in the shifting circuit 22. For example, if the second inverter INV2 is omitted, the enable signal EN that is received from the input terminal IT may be directly provided to the shifting circuit 22.

The control signal generator 30 generates a first control signal CS1 and a second control signal CS2 in response to the level-shifted enable signal LSEN. The first control signal CS1 may control the second depletion mode transistor NDH2 and the second control signal CS2 may control the second transistor NM1.

The control signal generator 30 may include a third inverter INV3 and a fourth inverter INV4. The third inverter INV3 may invert the level-shifted enable signal LSEN to generate the first control signal CS1. The fourth inverter INV4 may invert the first control signal CS1 to generate the second control signal CS2. Each of the third inverter INV3 and the fourth inverter INV4 may operate in response to the first voltage V1. Thus, as with the level-shifted enable signal LSEN, a high level of each of the first control signal CS1 and the second control signal CS2 may be substantially equal to the level of the first voltage V1.

In some example embodiments, one of the third inverter INV3 and the fourth inverter INV4 may be omitted. For example, if the fourth inverter INV4 is omitted, the level-shifted enable signal LSEN that is output from the level shifter 20 may be provided as the second control signal CS2.

In an example of FIG. 1, the first gate signal GS1 may be substantially the same as the first control signal CS1. In other words, the gate electrode of the first transistor PM1 may be directly connected to an output of the third inverter INV3 and the first transistor PM1 may receive the first control signal CS1 as the first gate signal GS1.

The second transistor NM1 has a gate electrode receiving the first voltage V1, and is turned on and off in response to the second control signal CS2 received at a first end (or a first electrode) NME1 of the second transistor NM1. A voltage at the gate electrode of the second transistor NM1 may always be fixed to the level of the first voltage V1. Thus, the second transistor NM1 may be turned on according to a level change of the second control signal CS2. For example, the second transistor NM1 may be a low voltage n-type metal oxide semiconductor (NMOS) transistor. A body voltage (or a body bias voltage) VB may be applied to a body of the second transistor NM1. For example, a level of the body voltage VB may be substantially equal to the level of the ground voltage GND.

The second depletion mode transistor NDH2 is connected between a second end (or a second electrode) NME2 of the second transistor NM1 and the output terminal OT, and has a gate electrode receiving the first control signal CS1. Unlike the second transistor NM1, a voltage at the gate electrode of the second depletion mode transistor NDH2 may not be fixed to a single voltage level. Instead, the gate electrode of the second depletion mode transistor NDH2 may receive the first control signal CS1 that has a variable voltage level and is associated with or corresponds to the enable signal EN (e.g., that is generated based on the enable signal EN). For example, the second depletion mode transistor NDH2 may be a high voltage n-type depletion mode transistor. The second depletion mode transistor NDH2 and the first depletion mode transistor NDH1 may be manufactured with the same specification to have the same threshold voltage Vth.

The second transistor NM1 and the second depletion mode transistor NDH2 may block the output signal OS. For example, when the enable signal EN is inactivated, the second transistor NM1 may be turned on in response to the second control signal CS2, and the output signal OS may decrease to the level of the ground voltage GND by the second transistor NM1 and the second depletion mode transistor NDH2. When the enable signal EN is activated, the second transistor NM1 may be turned off in response to the second control signal CS2, and a voltage at the second end NME2 of the second transistor NM1 which is connected to the second depletion mode transistor NDH2 may decrease in response to the first control signal CS1, as will be described with reference to FIG. 2.

In some example embodiments, the transistors PM1, NDH1 and NDH2 may be implemented with the high voltage transistors, as described above. A channel of the high voltage transistor may be longer than a channel of the low voltage transistor so as to endure a relatively high voltage (e.g., to prevent punch through between a source electrode and a drain electrode). In addition, a gate oxide layer of the high voltage transistor may be thicker than a gate oxide layer of the low voltage transistor so as to endure a relatively high voltage (e.g., withstand a relatively high electric potential difference between a gate electrode and the drain/source electrodes). Accordingly, the high voltage transistor may require a wider chip area than the low voltage transistor.

Figure 2:
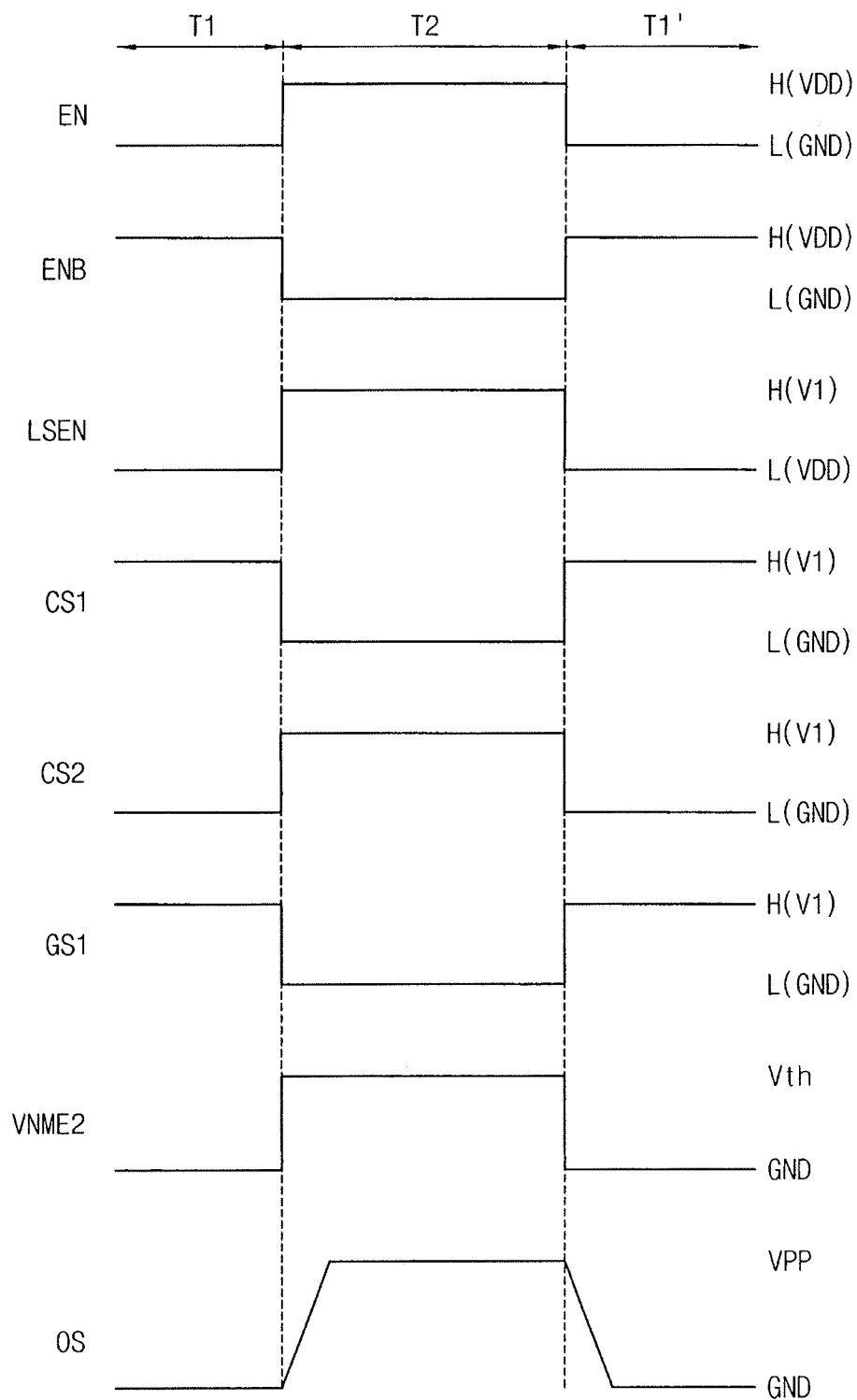
FIG. 2 illustrates a timing diagram of an operation of the high voltage switch circuit of FIG. 1.

FIG. 2 is a timing diagram illustrating an operation of the high voltage switch circuit of FIG. 1. Referring to FIGS. 1 and 2, the high voltage switch circuit 10 may operate in one of two operation modes. For example, the high voltage switch circuit 10 may operate in an off mode or an on mode. An operation during time intervals T1 and T1' may correspond to an operation in the off mode, and an operation during time interval T2 may correspond to an operation in the on mode.

During the time interval T1, in which the high voltage switch circuit 10 operates in the off mode, the enable signal EN may be inactivated to have a low level, and the inverted enable signal ENB may have a high level (e.g., a first high level which is the level of the first driving voltage VDD) opposite to the enable signal EN. The level shifter 20 may shift the level of the enable signal EN to generate the level-shifted enable signal LSEN. The enable signal EN and the level-shifted enable signal LSEN may have the same phase, and thus the level-shifted enable signal LSEN may also have a low level.

The control signal generator 30 may generate the first control signal CS1 and the second control signal CS2 in response to the level-shifted enable signal LSEN. The third inverter INV3 may invert the level-shifted enable signal LSEN to generate the first control signal CS1, such that the first control signal CS1 has a high level (e.g., a second high level, i.e., the level of the first voltage V1). The fourth inverter INV4 may invert the first control signal CS1 to generate the second control signal CS2, such that the second control signal CS2 has a low level.

The second transistor NM1 may be turned on in response to the second control signal CS2 having a low level, and the ground voltage GND corresponding to a low level may be provided to the output terminal OT through the second transistor NM1 and the second depletion mode transistor NDH2. Thus, a voltage VNME2 at the second end NME2 of the second transistor NM1 and the output signal OS may have the level of the ground voltage GND (e.g., a low level). The ground voltage GND may also be provided from the output terminal OT to the gate electrode of the first depletion mode transistor NDH1, and the voltage at the first electrode of the first transistor PM1 may be set to the threshold voltage Vth of the first depletion mode transistor NDH1. As the first control signal CS1 may be provided as the first gate signal GS1, the first gate signal GS1 having a high level (e.g., the second high level) may be applied to the gate electrode of the first transistor PM1, and thus the first transistor PM1 may be turned off.

The operation mode may be changed from the off mode to the on mode based on an internal or external control. During the time interval T2 in which the high voltage switch circuit 10 operates in the on mode, the enable signal EN may be activated to have a high level (e.g., the first high level), and the inverted enable signal ENB may have a low level opposite to the enable signal EN. As with the enable signal EN, the level-shifted enable signal LSEN and the second control signal CS2 may have a high level (e.g., the second high level). The high level of the enable signal EN may correspond to the level of the first driving voltage VDD, and the high level of the level-shifted enable signal LSEN and the second control signal CS2 may correspond to the level of the first voltage V1. As with the inverted enable signal ENB, the first control signal CS1 may have a low level.

When the first control signal CS1 is provided as the first gate signal GS1, the first transistor PM1 may be turned on in response to the first gate signal GS1 having a low level, and the output signal OS may increase to the level of the second drive voltage VPP by the feedback structure of the first transistor PM1 and the first depletion mode transistor NDH1, as described with reference to FIG. 1. In addition, the second transistor NM1 may be turned off in response to the second control signal CS2 having a high level, the ground voltage GND may be provided to the gate electrode of the second depletion mode transistor NDH2 by the first control signal CS1 having a low level. Thus, the voltage VNME2 at the second end NME2 of the second transistor NM1 may be set to the threshold voltage Vth of the second depletion mode transistor NDH2. In other words, as a voltage level of the first control signal CS1 applied to the gate electrode of the second depletion mode transistor NDH2 decreases in the on mode, the voltage VNME2 at the second end NME2 of the second transistor NM1 may decrease as compared with a case in which the voltage level of the first control signal CS1 is maintained. Thus, a voltage difference between the body voltage VB applied to the body of the second transistor NM1 and the voltage VNME2 at the second end NME2 of the second transistor NM1 may decrease, e.g., reducing off-stress for the second transistor NM1.

The operation mode may be changed from the on mode to the off mode based on an internal or external control. During the time interval T1' in which the high voltage switch circuit 10 operates in the off mode, the enable signal EN may be inactivated to have a low level, and the output signal OS may decrease to the level of the ground voltage GND. An operation during the time interval T1' may be substantially the same as an operation during the time interval T1.

As illustrated in FIG. 2, the phase of the enable signal EN, the phase of the level-shifted enable signal LSEN and a phase of the second control signal CS2 may be substantially the same as each other. A phase of the inverted enable signal ENB, a phase of the first control signal CS1 and a phase of the first gate signal GS1 may be substantially the same as each other. The high level of the enable signal EN and the high level of the inverted enable signal ENB may be substantially equal to the level of the first driving voltage VDD. The high level of the level-shifted enable signal LSEN, the high level of the first control signal CS1, the high level of the second control signal CS2, and the high level of the first gate signal GS1 may be substantially equal to the level of the first voltage V1. The voltage VNME2 at the second end NME2 of the second transistor NM1 during the on mode may be substantially equal to the threshold voltage Vth of the second depletion mode transistor NDH2. The low level of all signals may be substantially equal to the level of the ground voltage GND.

In the high voltage switch circuit 10 according to example embodiments, the voltage at the gate electrode of the second depletion mode transistor NDH2 may not be fixed to a single voltage level, and the first control signal CS1 having a variable voltage level associated with the enable signal EN may be applied to the gate electrode of the second depletion mode transistor NDH2. During the on mode in which the output signal OS increases to the level of the second drive voltage VPP and the second transistor NM1 is turned off, and the level of the first control signal CS1 may be changed to the low level that is substantially equal to the level of the ground voltage GND. Thus, the voltage VNME2 at the second end NME2 of the second transistor NM1 connected to the second depletion mode transistor NDH2 may decrease to the threshold voltage Vth of the second depletion mode transistor NDH2 in response to the first control signal CS1 associated with the enable signal EN. Accordingly, an off-stress for the second transistor NM1 may be reduced, the second transistor NM1 and the high voltage switch circuit 10 may have relatively improved or enhanced reliability, and the nonvolatile memory device including the high voltage switch circuit 10 may have relatively improved or enhanced lifetime.

Figure 3:
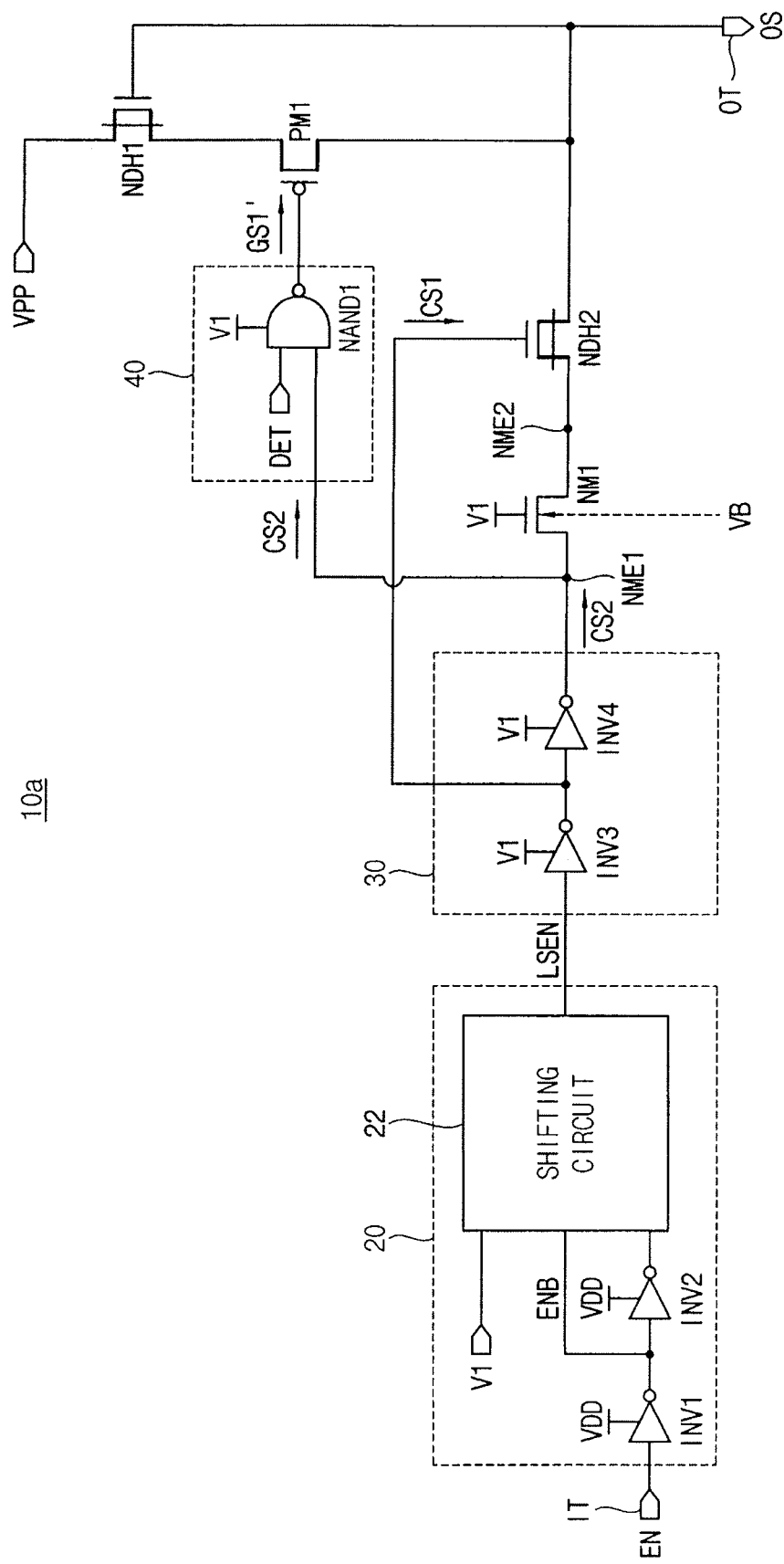
FIG. 3 illustrates a circuit diagram of a high voltage switch circuit according to example embodiments.
Figure 4:
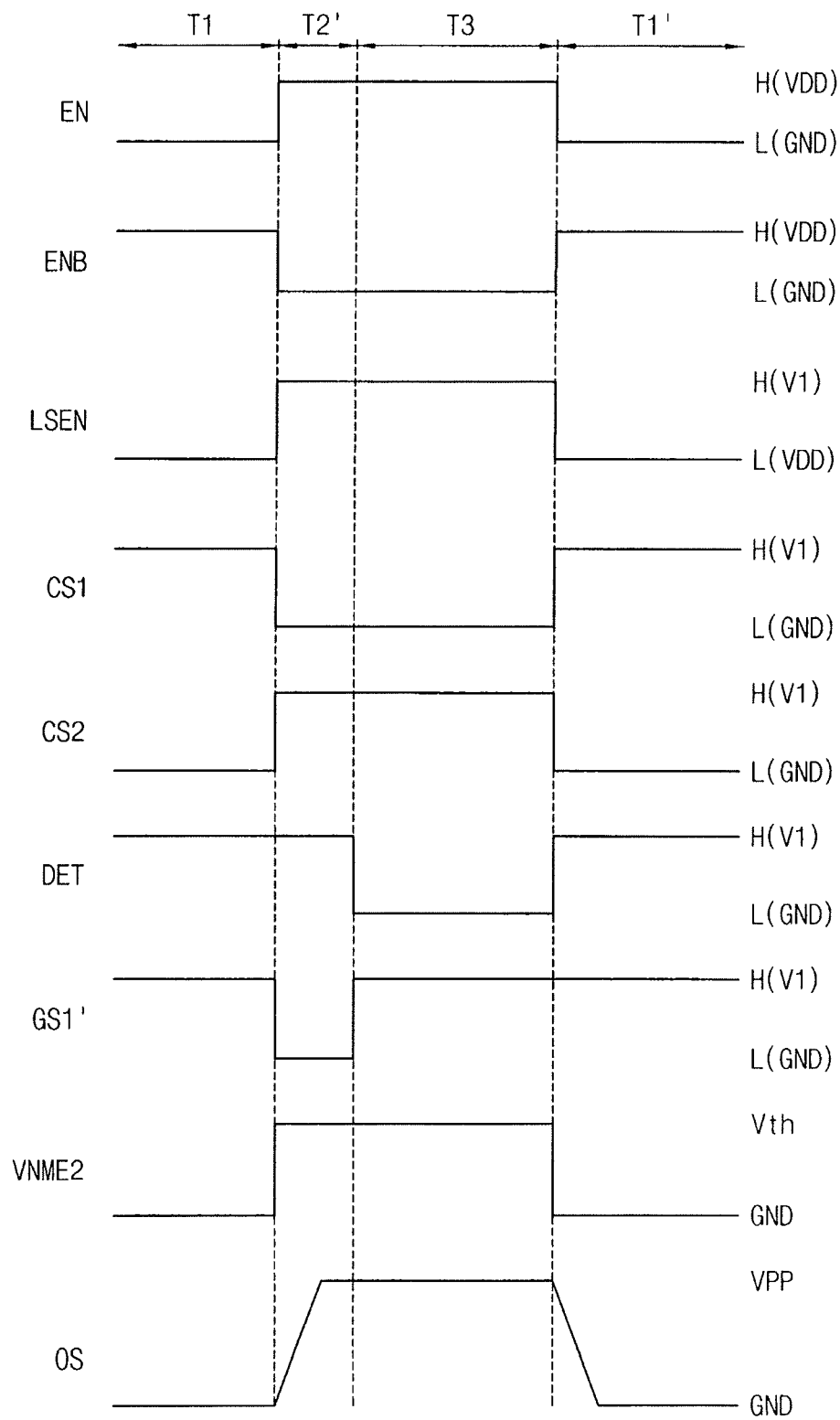
FIG. 4 illustrates a timing diagram of an operation of the high voltage switch circuit of FIG. 3.

FIG. 3 is a circuit diagram illustrating a high voltage switch circuit according to example embodiments. FIG. 4 is a timing diagram illustrating an operation of the high voltage switch circuit of FIG. 3. The descriptions repeated with FIGS. 1 and 2 will be omitted.

Referring to FIGS. 3 and 4, a high voltage switch circuit 10a includes the first transistor PM1, the first depletion mode transistor NDH1, the second transistor NM1, the second depletion mode transistor NDH2, the level shifter 20, and the control signal generator 30. The high voltage switch circuit 10a may further include a gate signal generator 40, the input terminal IT, and the output terminal OT.

The high voltage switch circuit 10a of FIGS. 3 and 4 may be substantially the same as the high voltage switch circuit 10 of FIGS. 1 and 2, except that the high voltage switch circuit 10a further includes the gate signal generator 40 and a relaxation mode is added between the on mode and the off mode. The gate signal generator 40 may generate a first gate signal GS F in response to the second control signal CS2 and a third control signal DET. The gate signal generator 40 may include a NAND gate NAND1.

The NAND gate NAND1 may include a first input terminal receiving the second control signal CS2, a second input terminal receiving the third control signal DET, and an output terminal outputting the first gate signal GS1'. The NAND gate NAND1 may perform a NAND operation on the second control signal CS2 and the third control signal DET to generate the first gate signal GS1'. The NAND gate NAND1 may operate in response to the first voltage V1. Thus, a high level of the first gate signal GS1' may be substantially equal to the level of the first voltage V1.

As illustrated in FIG. 4, the high voltage switch circuit 10a may operate in one of three operation modes. For example, the high voltage switch circuit 10a may operate in the off mode, the on mode, or the relaxation mode. An operation during time intervals T1 and T1' may correspond to an operation in the off mode, an operation during time interval T2' may correspond to an operation in the on mode, and an operation during time interval T3 may correspond to an operation in the relaxation mode.

During the time interval T1 in which the high voltage switch circuit 10a operates in the off mode, the third control signal DET may be inactivated to have a high level (e.g., the second high level), and the second control signal CS2 may have a low level. The NAND gate NAND1 included in the gate signal generator 40 may perform a NAND operation on the second control signal CS2 and the third control signal DET to generate the first gate signal GS1' having a high level (e.g., the second high level). The first transistor PM1 may be turned off in response to the first gate signal GS1'.

During the time interval T2', in which the high voltage switch circuit 10a operates in the on mode, the third control signal DET may be maintained to an inactivated state or a high level, the second control signal CS2 may have a high level, and, thus, the NAND gate NAND1 may generate the first gate signal GS1' having a low level. The first transistor PM1 may be turned on in response to the first gate signal GS1'. Thus, the output signal OS may increase to the level of the second drive voltage VPP by the feedback structure of the first transistor PM1 and the first depletion mode transistor NDH1.

After a predetermined time has elapsed from a time at which the enable signal EN is activated (e.g., from a time at which the on mode begins), the third control signal DET may be activated to have a low level, and the relaxation mode may begin. For example, the third control signal DET may be activated after the on mode is started and the output signal OS increases to the level of the second driving voltage VPP.

During the time interval T3, in which the high voltage switch circuit 10a operates in the relaxation mode, the second control signal CS2 may be maintained to a high level, the third control signal DET may be changed to an activated state or a low level, and thus the NAND gate NAND1 may generate the first gate signal GS1' having a high level. Since the output signal OS has already increased to the level of the second driving voltage VPP, the voltage at the first electrode of the first transistor PM1 may be set to the second driving voltage VPP. Thus, the first transistor PM1 may not be turned off even if the first gate signal GS1' has a high level. In addition, as the first gate signal GS1' has a high level, a voltage difference between the first electrode and the gate electrode of the first transistor PM1 may be reduced. Thus, deterioration or degradation of the first transistor PM1 may be prevented.

When the operation mode is changed from the relaxation mode to the off mode, an operation during the time interval T1' may be substantially the same as an operation during the time interval T1. As illustrated in FIG. 4, the high level of the third control signal DET and the high level of the first gate signal GS1' may be substantially equal to the level of the first voltage V1.

In the high voltage switch circuit 10a according to example embodiments, the voltage VNME2 at the second end NME2 of the second transistor NM1 may decrease to the threshold voltage Vth of the second depletion mode transistor NDH2 in response to the first control signal CS1 associated with the enable signal EN during the on mode. In addition, the level of the first gate signal GS1' applied to the gate electrode of the first transistor PM1 may increase during the relaxation mode after the on mode. Accordingly, an off-stress for the second transistor NM1 may be reduced, deterioration or degradation of the first transistor PM1 may be prevented, and thus the high voltage switch circuit 10a may have more improved or enhanced reliability.

Figure 5:
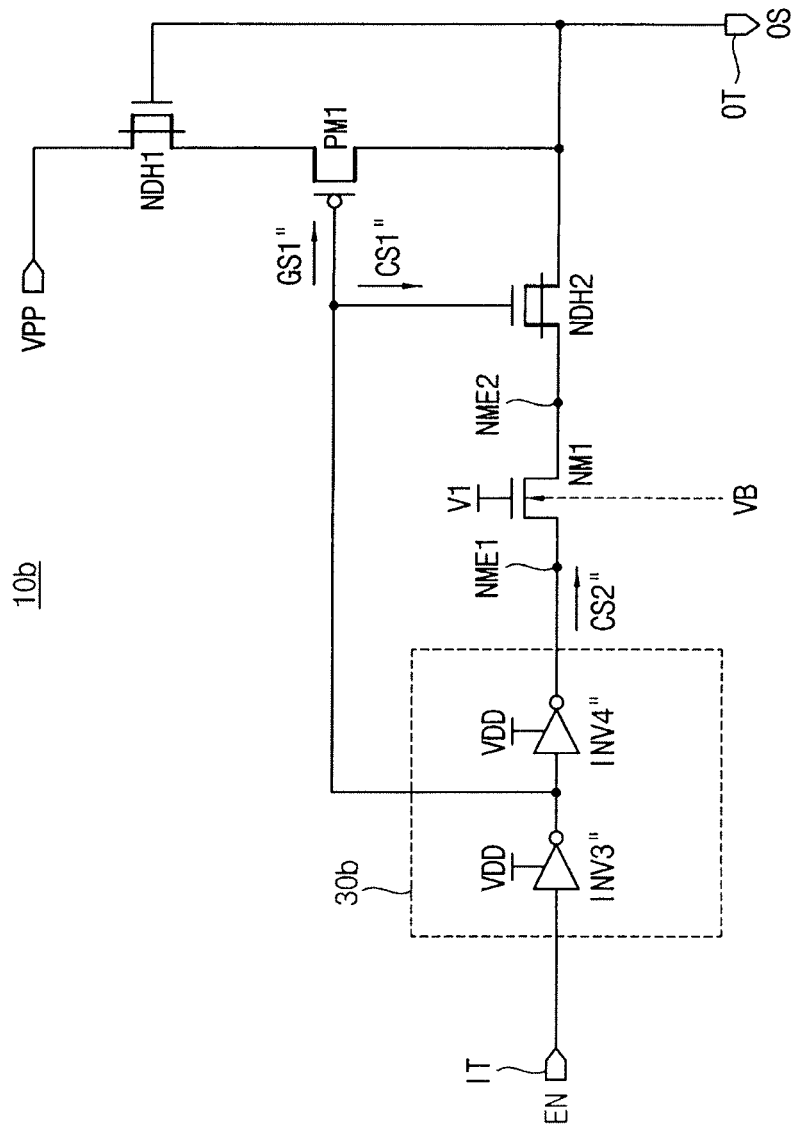
FIG. 5 illustrates a circuit diagram of a high voltage switch circuit according to example embodiments.

FIG. 5 is a circuit diagram illustrating a high voltage switch circuit according to example embodiments. The descriptions repeated with FIGS. 1 and 3 will be omitted. Referring to FIG. 5, a high voltage switch circuit 10b includes the first transistor PM1, the first depletion mode transistor NDH1, the second transistor NM1, the second depletion mode transistor NDH2, and a control signal generator 30b. The high voltage switch circuit 10b may further include the input terminal IT and the output terminal OT.

The high voltage switch circuit 10b of FIG. 5 may be substantially the same as the high voltage switch circuit 10 of FIG. 1, except that the level shifter 20 is omitted and a configuration of the control signal generator 30b is changed. The control signal generator 30b generates the first control signal CS1" and the second control signal CS2" in response to the enable signal EN. The first control signal CS1" may be used for controlling the second depletion mode transistor NDH2, and the second control signal CS2" may be used for controlling the second transistor NM1.

The control signal generator 30b may include a third inverter INV3" and a fourth inverter INV4". The third inverter INV3" may invert the enable signal EN to generate the first control signal CS1". The fourth inverter INV4" may invert the first control signal CS1" to generate the second control signal CS2". The high level of the enable signal EN received from the input terminal IT may be substantially equal to the level of the first driving voltage VDD and each of the third inverter INV3" and the fourth inverter INV4" may operate in response to the first driving voltage VDD. Thus, a high level of each of the first control signal CS1" and the second control signal CS2" may be substantially equal to the level of the first driving voltage VDD.

In an example of FIG. 5, a first gate signal GS1" may be substantially the same as the first control signal CS1", and thus a high level of the first gate signal GS1" may be substantially equal to the level of the first driving voltage VDD. An operation of the high voltage switch circuit 10b of FIG. 5 may be substantially the same as an operation of the high voltage switch circuit 10 illustrated in FIG. 2, except that high levels of the signals CS1", CS2" and GS1" are changed. In some example embodiments, the first driving voltage VDD and the first voltage V1 may have the same level.

The high voltage switch circuit 10b may further include the gate signal generator 40 described with reference to FIG. 3. Example embodiments are described based on cases where the first transistor PM1 is a PMOS transistor, the second transistor NM1 is an NMOS transistor and the depletion mode transistors NDH1 and NDH2 are N-type depletion mode transistors. In other example embodiments, types of the transistors included in the high voltage switch circuit and voltage levels of the signals in the operation modes may be changed according to example embodiments.

Figure 6:
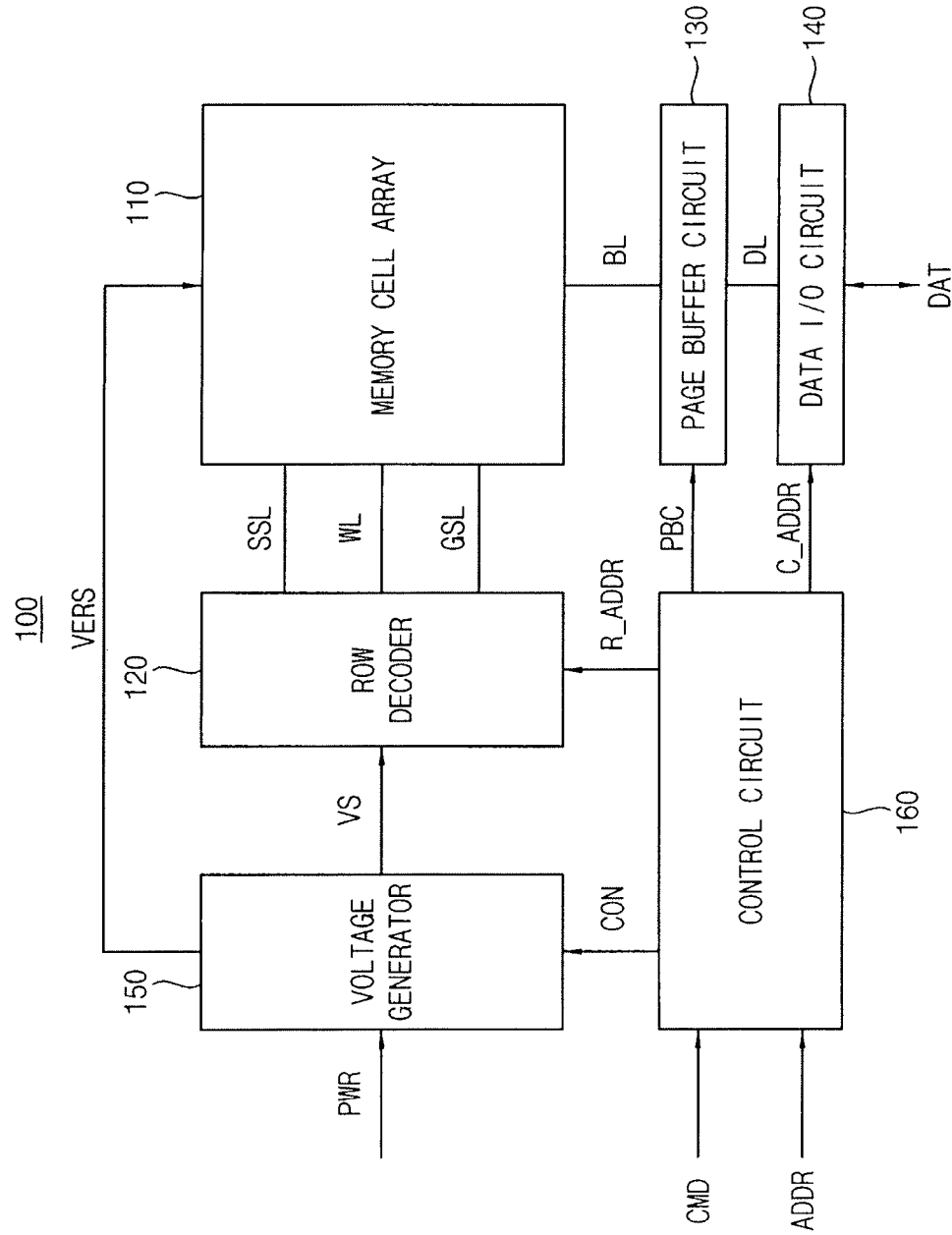
FIG. 6 illustrates a nonvolatile memory device according to example embodiments.

FIG. 6 illustrates a nonvolatile memory device according to example embodiments. Referring to FIG. 6, a nonvolatile memory device 100 includes a memory cell array 110, a row decoder 120, a page buffer circuit 130, a data input/output (I/O) circuit 140, a voltage generator 150, and a control circuit 160.

The memory cell array 110 is connected to the row decoder 120 via a plurality of string selection lines SSL, a plurality of wordlines WL and a plurality of ground selection lines GSL. The memory cell array 110 is further connected to the page buffer circuit 130 via a plurality of bitlines BL.

The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks, each of which includes memory cells. As will be described below with reference to FIGS. 8A and 8B, the plurality of memory cells may be arranged in a two dimensional (2D) array structure or a three dimensional (3D) vertical array structure.

The control circuit 160 receives a command CMD and an address ADDR from a memory controller (e.g., a memory controller 600 in FIG. 9), and controls erasure, programming, and read operations of the nonvolatile memory device 100 based on the command CMD and the address ADDR. An erasure operation may include performing a sequence of erase loops and a program operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the row decoder 120 and may provide the column address C_ADDR to the data I/O circuit 140.

The row decoder 120 may be connected to the memory cell array 110 via the plurality of string selection lines SSL, the plurality of wordlines WL and the plurality of ground selection lines GSL. As will be described below with reference to FIG. 7, the row decoder 120 may include a high voltage switch circuit according to example embodiments.

For example, in the data erase/write/read operations, the row decoder 120 may determine, based on the row address R_ADDR, at least one of the plurality of wordlines WL as a selected wordline and the rest or remainder of the plurality of wordlines WL other than the selected wordline as unselected wordlines.

In addition, in the data erase/write/read operations, the row decoder 120 may determine, based on the row address R_ADDR, at least one of the plurality of string selection lines SSL as a selected string selection line and the rest or remainder of the plurality of string selection lines SSL other than the selected string selection line as unselected string selection line.

Further, in the data erase/write/read operations, the row decoder 120 may determine, based on the row address R_ADDR, at least one of the plurality of ground selection lines GSL as a selected ground selection line and the rest or remainder of the plurality of ground selection lines GSL other than the selected ground selection line, as unselected ground selection lines.

The voltage generator 150 may generate voltages VS for an operation of the nonvolatile memory device 100 based on a power PWR and the control signals CON. The voltages VS may be applied to the plurality of string selection lines SSL, the plurality of wordlines WL, and the plurality of ground selection lines GSL via the row decoder 120. In addition, the voltage generator 150 may generate an erase voltage VERS for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line contact and/or the bitline BL of a memory block (e.g., a selected memory block) and may apply an erase permission voltage (e.g., a ground voltage) to all wordlines of the memory block or a portion of the wordlines via the row decoder 120. In addition, during the erase verification operation, the voltage generator 150 may apply an erase verification voltage simultaneously to all wordlines of the memory block or sequentially to the wordlines one by one.

For example, during the program operation, the voltage generator 150 may apply a program voltage to the selected wordline and may apply a program pass voltage to the unselected wordlines via the row decoder 120. In addition, during the program verification operation, the voltage generator 150 may apply a program verification voltage to the selected wordline and may apply a verification pass voltage to the unselected wordlines via the row decoder 120.

In addition, during the normal read operation, the voltage generator 150 may apply a read voltage to the selected wordline and may apply a read pass voltage to the unselected wordlines via the row decoder 120. During the data recover read operation, the voltage generator 150 may apply the read voltage to a wordline adjacent to the selected wordline and may apply a recover read voltage to the selected wordline via the row decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 9) to the memory cell array 110 via the page buffer circuit 130 or may provide the data DAT from the memory cell array 110 to the outside of the nonvolatile memory device 100, based on the column address C_ADDR.

Figure 7:
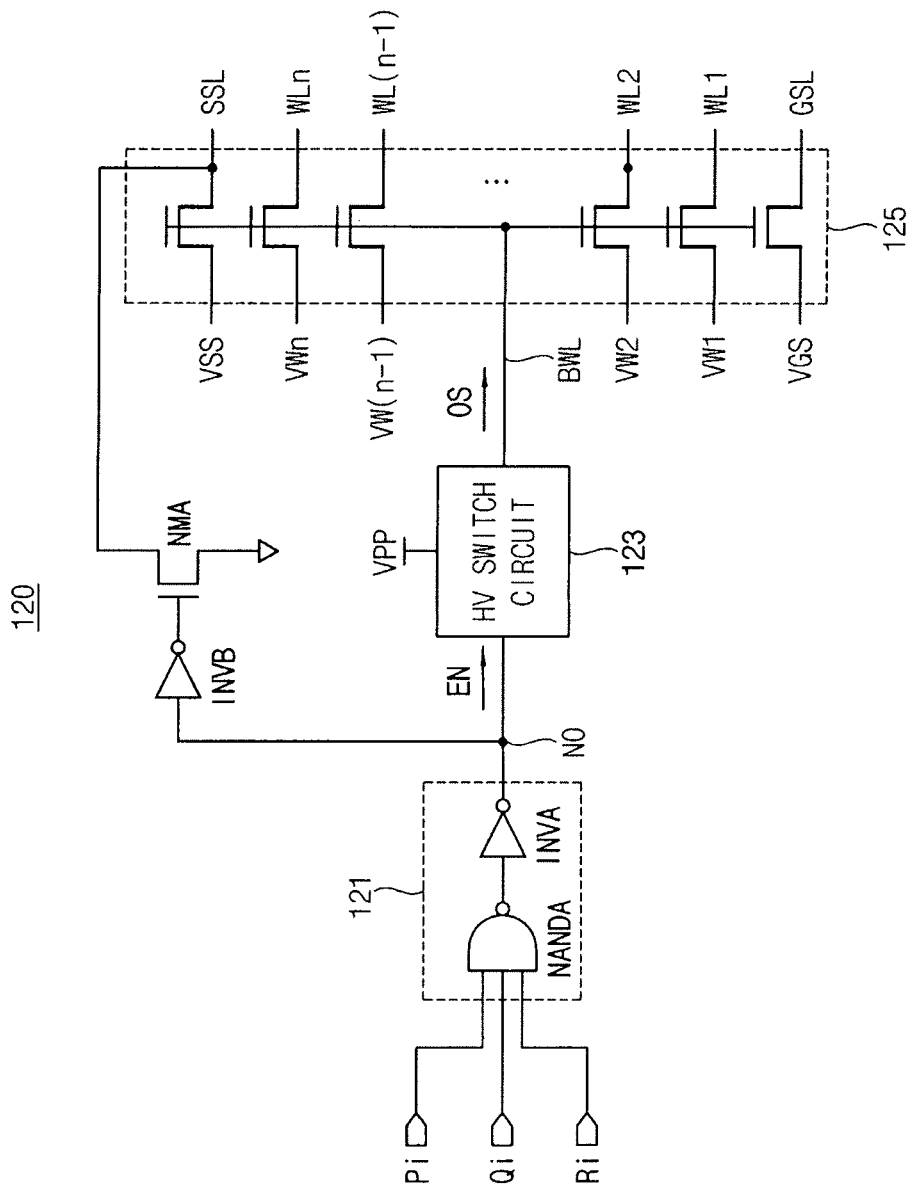
FIG. 7 illustrates a circuit diagram of an example of a row decoder included in a nonvolatile memory device according to example embodiments.

FIG. 7 is a circuit diagram illustrating an example of a row decoder included in a nonvolatile memory device according to example embodiments. Referring to FIGS. 6 and 7, a row decoder 120 may include a decoder 121, a high voltage switch circuit 123, and pass transistors 125. The row decoder 120 may further include an inverter INVB and a switch NMA.

The decoder 121 may be a block decoder for selecting one memory block of the memory cell array 110. The decoder 121 may include a NAND gate NANDA and an inverter INVA.

The NAND gate NANDA may perform a NAND operation on decoding signals Pi, Qi, and Ri provided by the row address R_ADDR from the control circuit 160. The inverter INVA may invert an output of the NAND gate NANDA. An output of the inverter INVA may be transmitted to the node NO as a low voltage block selection signal (e.g., the enable signal EN). The decoder 121 may further include an element for blocking the output of the NAND gate NANDA depending on whether the selected block is a bad block.

When all the decoding signals Pi, Qi, and Ri are activated, the node NO may be set to a high level and the switch NMA for disabling the string selection line SSL may be blocked (e.g., turned off). The high voltage switch circuit 123 may output a logic value of the node NO as a boosted block selection signal (e.g., the output signal OS) that is boosted to a high voltage. The boosted block selection signal having the high voltage may be transferred to a block wordline BWL. The pass transistors 125 may be switched by the boosted block selection signal having the high voltage transferred through the block wordline BWL.

The pass transistors 125 may transmit voltages VGS, VW1, VW2, . . . , VW(n−1), VWn, and VSS generated from the voltage generator 150 to wordlines WL1, WL2, . . . , WL(n−1), and WLn, and selection lines SSL and GSL. The voltages transmitted by the pass transistors 125 may be a high voltage relatively higher than a voltage driving a general circuit. Thus, the pass transistors 125 may include a high voltage transistor being driven based on a relatively high voltage. A channel of the high voltage transistor may be longer than a channel of a low voltage transistor so as to endure a relatively high voltage (e.g., to prevent punch through between a source electrode and a drain electrode). In addition, a gate oxide layer of the high voltage transistor may be thicker than a gate oxide layer of the low voltage transistor so as to endure a relatively high voltage, (e.g., withstand a relatively high electric potential difference between a gate electrode and the drain/source electrodes). Accordingly, the high voltage transistor may require a wider chip area than the low voltage transistor.

The high voltage switch circuit 123 may be a high voltage switch circuit according to example embodiments. For example, the high voltage switch circuit 123 may include the feedback structure of the depletion mode transistor and the PMOS transistor to convert the block selection signal of the low voltage (e.g., VDD) to the high voltage (e.g., VPP). In addition, the voltage VNME2 at the second end NME2 of the second transistor NM1 may decrease to the threshold voltage Vth of the second depletion mode transistor NDH2 in response to the first control signal CS1 associated with the enable signal EN during the on mode. Accordingly, an off-stress for the second transistor NM1 may be reduced, the second transistor NM1 and the high voltage switch circuit 123 may have relatively improved or enhanced reliability, and the nonvolatile memory device 100 may have relatively improved or enhanced lifetime.

In some example embodiments, the high voltage VPP provided to the high voltage switch circuit 123 may be generated from a separate high voltage generator outside the nonvolatile memory device 100. In other example embodiments, the high voltage VPP provided to the high voltage switch circuit 123 may be generated by the voltage generator 150 included in the nonvolatile memory device 100.

Figure 8A:
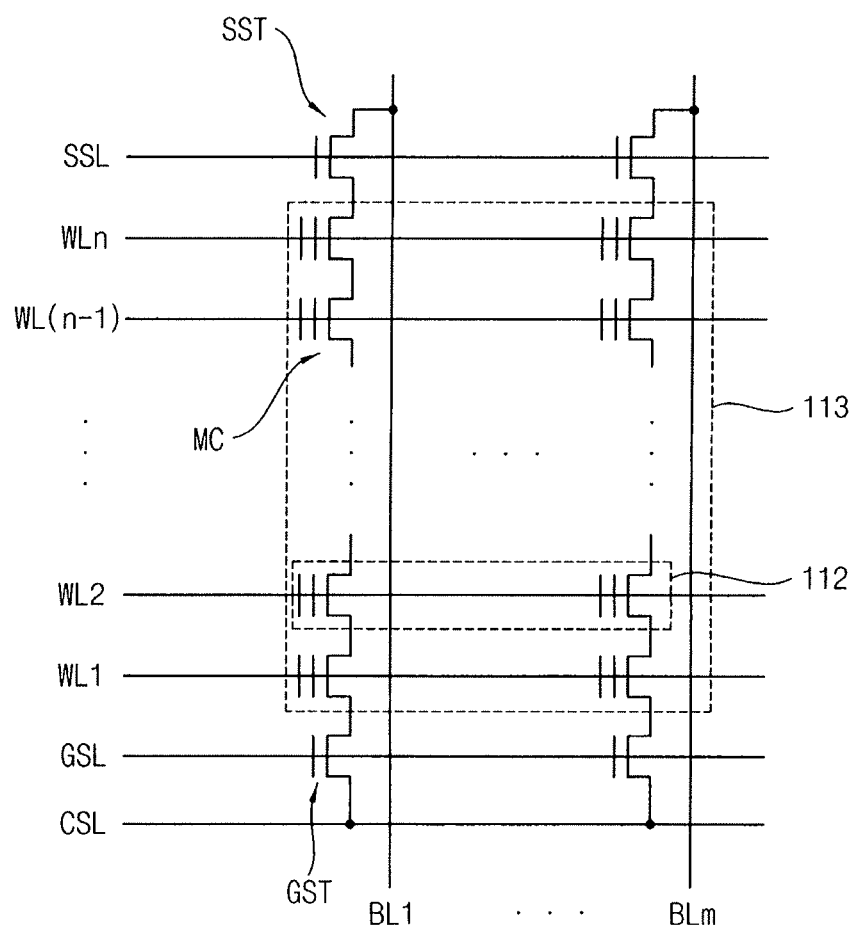
FIGS. 8A and 8B illustrate examples of a memory cell array that is included in a nonvolatile memory device according to example embodiments.
Figure 8B:
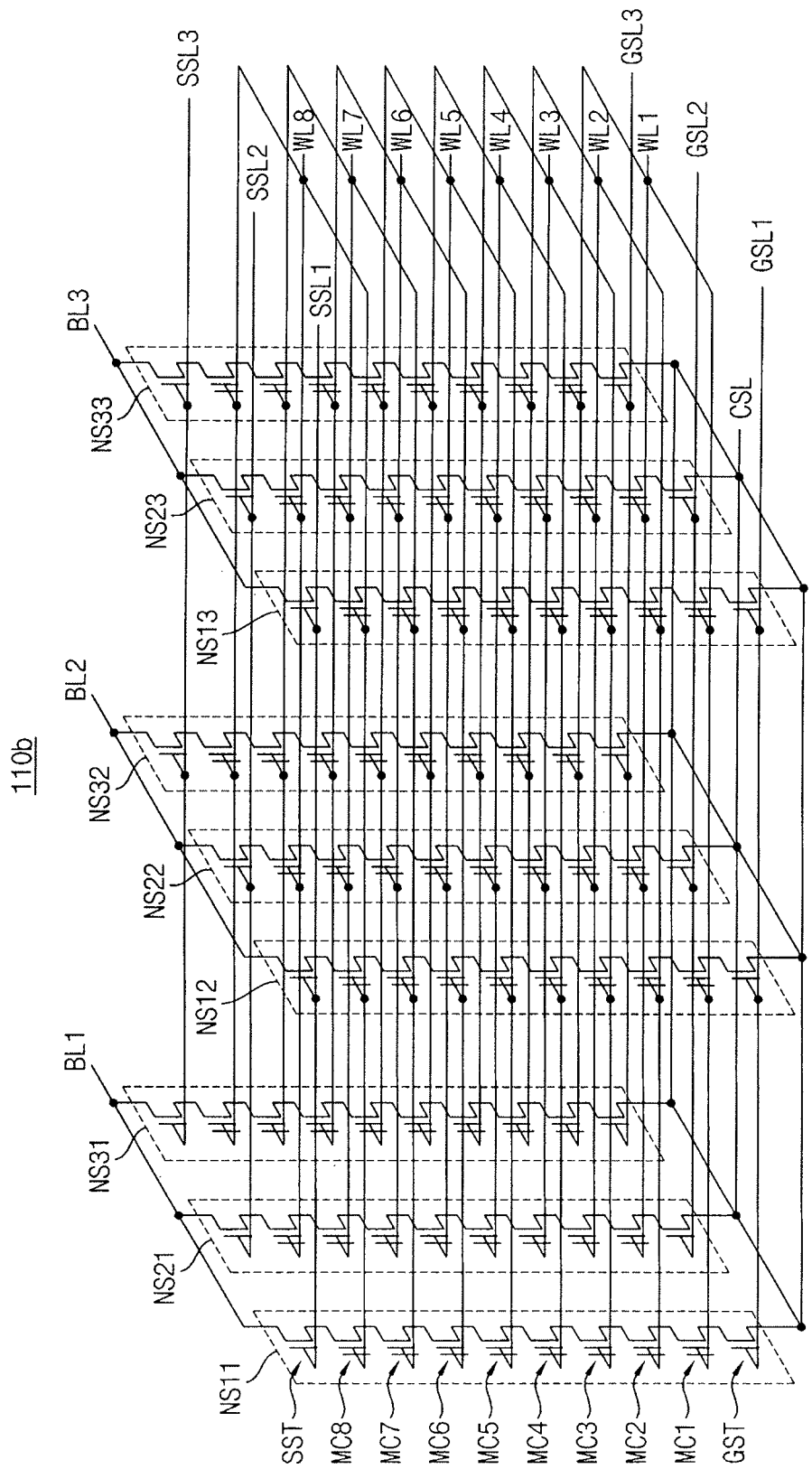

FIGS. 8A and 8B are diagrams illustrating examples of a memory cell array that is included in a nonvolatile memory device according to example embodiments. FIG. 8A illustrates an example of a memory cell array included in a NAND flash memory device. FIG. 8B illustrates an example of a memory cell array included in a vertical NAND flash memory device.

Referring to FIG. 8A, a memory cell array 110a may include string selection transistors SST, ground selection transistors GST, and memory cells MC. The string selection transistors SST may be connected to bitlines BL1, . . . , BLm, and the ground selection transistors GST may be connected to a common source line CSL. The memory cells arranged in the same row may be in series between one of the bitlines BL1~BLm and the common source line CSL, and the memory cells arranged in the same column may be connected in common to one of wordlines WL1, WL2, . . . , WL(n−1), WLn. In other words, the memory cells MC may be connected in series between the string selection transistors SST and the ground selection transistors GST, and n wordlines, e.g., 16, 32, 64, etc., may be between a string selection line SSL connected to the string selection transistors SST and a ground selection line GSL connected to the ground selection transistors GST.

The string selection transistors SST may be connected to the string selection line SSL such that the string selection transistors SST are controlled according to a level of a voltage applied from the string selection line SSL. The ground selection transistors GST may be connected to the ground selection line GSL such that the ground selection transistors GST are controlled according to a level of a voltage applied from the ground selection line GSL. The memory cells MC may be controlled according to levels of voltages applied to the wordlines WL1~WLn.

The NAND flash memory device including the memory cell array 110a may perform the data read and write operations in units of page 112 and the data erase operation in units of block 113.

Referring to FIG. 8B, one memory block 110b of the memory cell array is illustrated. The memory block 110b of FIG. 8B may be formed on a substrate in a three-dimensional structure (or a vertical structure). For example, a plurality of cell strings (e.g., vertical NAND strings) included in the memory block 110b may be formed in a direction perpendicular to the substrate.

The memory block 110b may include a plurality of cell strings NS11, NS12, NS13, NS21, NS22, NS23, NS31, NS32, and NS33 connected between bitlines BL1, BL2, and BL3, and a common source line CSL. Each of the cell strings NS11~NS33 may include a string selection transistor SST, a plurality of memory cells MC1, MC2, MC3, MC4, MC5, MC6, MC7, and MC8, and a ground selection transistor GST.

Each string selection transistor SST may be connected to a corresponding string selection line (one of SSL1, SSL2 and SSL3). The plurality of memory cells MC1-MC8 may be connected to corresponding wordlines WL1, WL2, WL3, WL4, WL5, WL6, WL7, and WL8, respectively. Each ground selection transistor GST may be connected to a corresponding ground selection line (one of GSL1, GSL2, and GSL3). Each string selection transistor SST may be connected to a corresponding bitline (e.g., one of BL1-BL3), and each ground selection transistor GST may be connected to the common source line CSL.

The cell strings connected in common to one bitline may form one column, and the cell strings connected to one string selection line may form one row. For example, the cell strings NS11, NS21, and NS31 connected to the first bitline BL1 may correspond to a first column, and the cell strings NS11, NS12, and NS13 connected to the first string selection line SSL1 may form a first row.

Wordlines (e.g., WL1) having the same height may be commonly connected, and the ground selection lines GSL1~GSL3 and the string selection lines SSL1~SSL3 may be separated. Memory cells located at the same semiconductor layer may share a wordline. Cell strings in the same row may share a string selection line. The common source line CSL may be connected in common to all of cell strings.

In FIG. 8B, the memory block 110b is illustrated to be connected to eight wordlines WL1~WL8 and three bitlines BL1~BL3, and each of the cell strings NS11~NS33 is illustrated to include eight memory cells MC1~MC8. In some example embodiments, each memory block in the memory cell array 110 may be connected to any number of wordlines and bitlines, and/or each cell string may include any number of memory cells.

A three-dimensional vertical array structure may include vertical NAND strings that are vertically oriented such that at least one memory cell is located over another memory cell. The at least one memory cell may include a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 9:
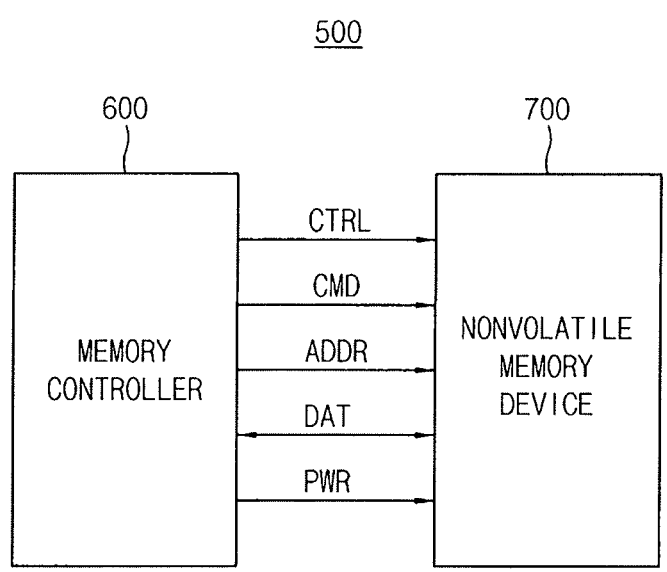
FIG. 9 illustrates a memory system according to example embodiments.

FIG. 9 illustrates memory system according to example embodiments. Referring to FIG. 9, a memory system 500 includes a memory controller 600 and at least one nonvolatile memory device 700.

The nonvolatile memory device 700 may correspond to the nonvolatile memory device according to example embodiments, may include the high voltage switch circuit according to example embodiments, and may perform data erase, program (or write) and/or read operations under control of the memory controller 600. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 10:
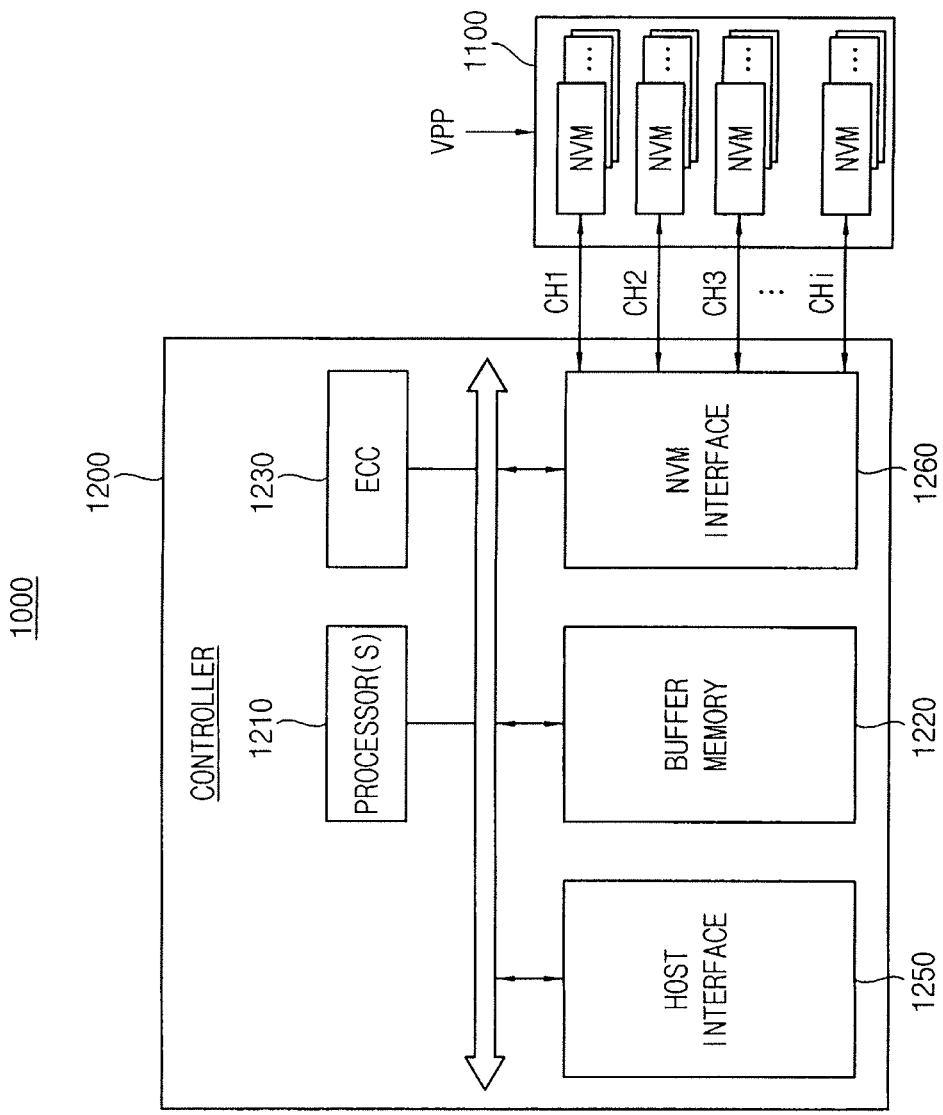
FIG. 10 illustrates a storage device that includes a nonvolatile memory device according to example embodiments.

FIG. 10 illustrates a storage device that includes a nonvolatile memory device according to example embodiments. Referring to FIG. 10, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3, . . . , CHi. The controller 1200 may include one or more processors 1210, a buffer memory 1220, an error correction code (ECC) circuit 1230, a host interface 1250, and a nonvolatile memory interface 1260.

The buffer memory 1220 may store data used to drive the controller 1200. The ECC circuit 1230 may calculate error correction code values of data to be programmed during a program operation and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments and may be optionally supplied with an external high voltage VPP.

Embodiments may be applied to various electronic devices and electronic systems including the nonvolatile memory device. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

By way of summation and review, in the high voltage switch circuit according to one or more embodiments, the nonvolatile memory device and the memory system according to example embodiments, the voltage at the gate electrode of the second depletion mode transistor may not be fixed to a single voltage level. Instead, the first control signal having a variable voltage level associated with the enable signal may be applied to the gate electrode of the second depletion mode transistor. During the on mode, the level of the first control signal may be changed to the low level. Thus, the voltage at the other end of the second transistor connected to the second depletion mode transistor may decrease to the threshold voltage of the second depletion mode transistor in response to the first control signal. Accordingly, an off-stress for the second transistor may be reduced, the second transistor and the high voltage switch circuit may have relatively improved or enhanced reliability, and the nonvolatile memory device including the high voltage switch circuit may have relatively improved or enhanced lifetime.

At least one example embodiment of the present disclosure provides a high voltage switch circuit capable of reducing an off-stress for an internal transistor. At least one example embodiment of the present disclosure provides a nonvolatile memory device including the high voltage switch circuit. At least one example embodiment of the present disclosure provides a memory system including the nonvolatile memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A high voltage switch circuit operating in response to a first driving voltage and a second driving voltage higher than the first driving voltage, the high voltage switch circuit comprising:
   a first transistor to transmit the second driving voltage to an output terminal in response to a first gate signal;

a first depletion mode transistor to transmit the second driving voltage to the first transistor in response to an output signal fed back from the output terminal;

a level shifter to shift a level of an enable signal based on a first voltage to generate a level-shifted enable signal;

a control signal generator to generate a first control signal and a second control signal in response to the level-shifted enable signal;

a second transistor having a gate electrode connected to the first voltage, the second transistor to be turned on and off in response to the second control signal received at a first end of the second transistor; and a second depletion mode transistor connected between a second end of the second transistor and the output terminal, the second depletion mode transistor having a gate electrode receiving the first control signal.

2. The high voltage switch circuit as claimed in claim 1, wherein, when the enable signal is activated, the first transistor is turned on in response to the first gate signal, and the output signal increases to a level of the second driving voltage by a feedback structure of the first transistor and the first depletion mode transistor.

3. The high voltage switch circuit as claimed in claim 2, wherein, when the enable signal is activated, the second transistor is turned off in response to the second control signal, and a voltage at the second end of the second transistor which is connected to the second depletion mode transistor decreases in response to the first control signal.

4. The high voltage switch circuit as claimed in claim 3, wherein, when the voltage at the second end of the second transistor decreases, a voltage difference between a body voltage applied to a body of the second transistor and the voltage at the second end of the second transistor decreases.

5. The high voltage switch circuit as claimed in claim 3, wherein, when the enable signal is activated, a level of the enable signal is equal to a level of the first driving voltage, a level of the first control signal is equal to a level of a ground voltage, and the voltage at the second end of the second transistor is equal to a threshold voltage of the second depletion mode transistor.

6. The high voltage switch circuit as claimed in claim 1, wherein, when the enable signal is inactivated, the second transistor is turned on in response to the second control signal, and the output signal decreases to a level of a ground voltage by the second transistor and the second depletion mode transistor.

7. The high voltage switch circuit as claimed in claim 6, wherein, when the enable signal is inactivated, the first transistor is turned off in response to the first gate signal.

8. The high voltage switch circuit as claimed in claim 7, wherein, when the enable signal is inactivated, a level of the enable signal is equal to the level of the ground voltage, and a level of the first control signal is equal to a level of the first voltage.

9. The high voltage switch circuit as claimed in claim 1, wherein the first gate signal is the same as the first control signal.

10. The high voltage switch circuit as claimed in claim 1, further comprising a gate signal generator to generate the first gate signal in response to the second control signal and a third control signal.

11. The high voltage switch circuit as claimed in claim 10, wherein:

the third control signal is activated after a predetermined time has elapsed from a time at which the enable signal is activated, and a level of the first gate signal is changed in response to an activated third control signal after the enable signal is activated and the output signal increases to a level of the second driving voltage.

12. The high voltage switch circuit as claimed in claim 1, wherein:

the first control signal has a phase opposite to that of the enable signal, and the second control signal has a phase same as that of the enable signal.

13. The high voltage switch circuit as claimed in claim 12, wherein:

a high level of the enable signal is equal to a level of the first driving voltage, and a high level of each of the first control signal and the second control signal is equal to a level of the first voltage.

14. The high voltage switch circuit as claimed in claim 13, wherein the control signal generator includes:

a first inverter to invert the level-shifted enable signal to generate the first control signal; and a second inverter to invert the first control signal to generate the second control signal.

15. The high voltage switch circuit as claimed in claim 1, wherein the first voltage is higher than the first driving voltage and lower than the second driving voltage.

16. The high voltage switch circuit as claimed in claim 1, wherein:

the first transistor is a p-type metal oxide semiconductor (PMOS) transistor, and the second transistor is an n-type metal oxide semiconductor (NMOS) transistor.

17. A nonvolatile memory device, comprising:

a memory cell array including a memory cell connected to a wordline and a bitline;

a pass transistor to transmit a first high voltage to the wordline; and a high voltage switch circuit to boost a level of an enable signal to a level of a second high voltage to provide a boosted enable signal to a gate electrode of the pass transistor, wherein the high voltage switch circuit includes:

a first transistor to transmit the second high voltage to an output terminal in response to a first gate signal;

a first depletion mode transistor to transmit the second high voltage to the first transistor in response to an output signal fed back from the output terminal;

a level shifter to shift the level of the enable signal based on a first voltage to generate a level-shifted enable signal;

a control signal generator to generate a first control signal and a second control signal in response to the level-shifted enable signal;

a second transistor having a gate electrode connected to the first voltage, the second transistor to be turned on and off in response to the second control signal received at a first end of the second transistor; and a second depletion mode transistor connected between a second end of the second transistor and the output terminal, the second depletion mode transistor having a gate electrode connected to the first control signal.

18. The nonvolatile memory device as claimed in claim 17, further comprising a decoder to generate the enable signal in response to a row address.

19. The nonvolatile memory device as claimed in claim 17, wherein the enable signal is a block selection signal for selecting a memory block including the memory cell.

20. A memory system, comprising:
- a memory controller; and
- a nonvolatile memory device controlled by the memory controller, wherein the nonvolatile memory device includes:
- a memory cell array including a memory cell connected to a wordline and a bitline;
- a pass transistor to transmit a first high voltage to the wordline; and
- a high voltage switch circuit to boost a level of an enable signal to a level of a second high voltage to provide a boosted enable signal to a gate electrode of the pass transistor, wherein the high voltage switch circuit includes:
- a first transistor to transmit the second high voltage to an output terminal in response to a first gate signal;
- a first depletion mode transistor to transmit the second high voltage to the first transistor in response to an output signal fed back from the output terminal;
- a level shifter to shift the level of the enable signal based on a first voltage to generate a level-shifted enable signal;
- a control signal generator to generate a first control signal and a second control signal in response to the level-shifted enable signal;
- a second transistor having a gate electrode connected to the first voltage, the second transistor to be turned on and off in response to the second control signal received at a first end of the second transistor; and
- a second depletion mode transistor connected between a second end of the second transistor and the output terminal, the second depletion mode transistor having a gate electrode receiving the first control signal.

* * * * *